(12) United States Patent
Horiguchi et al.

(10) Patent No.: US 8,513,861 B2
(45) Date of Patent: Aug. 20, 2013

(54) PIEZOELECTRIC POWER GENERATOR

(75) Inventors: Chikahiro Horiguchi, Nagaokakyo (JP); Hidekazu Oishibashi, Nagaokakyo (JP); Hiroaki Kaida, Nagaokakyo (JP)

(73) Assignee: Murata Manufacturing Co., Ltd., Nagaokakyo-Shi, Kyoto-fu (JP)

( * ) Notice: Subject to any disclaimer, the term of this patent is extended or adjusted under 35 U.S.C. 154(b) by 0 days.

(21) Appl. No.: 13/316,691

(22) Filed: Dec. 12, 2011

(65) Prior Publication Data

US 2012/0080981 A1    Apr. 5, 2012

Related U.S. Application Data

(63) Continuation of application No. PCT/JP2010/060030, filed on Jun. 14, 2010.

(30) Foreign Application Priority Data

Jun. 15, 2009  (JP) ................... 2009-142789

(51) Int. Cl.
    *H01L 41/113*    (2006.01)
(52) U.S. Cl.
    CPC ................... *H01L 41/1136* (2013.01)
    USPC .......................... 310/339; 310/367
(58) Field of Classification Search
    CPC ............. H01L 41/113; H01L 41/1132; H01L 41/1134; H01L 41/1136; H01L 41/1138
    USPC .................. 310/330–332, 339, 367
    See application file for complete search history.

(56) References Cited

U.S. PATENT DOCUMENTS

| | | | |
|---|---|---|---|
| 6,433,465 B1 * | 8/2002 | McKnight et al. | 310/339 |
| 7,486,004 B2 * | 2/2009 | Allan et al. | 310/328 |
| 2007/0145861 A1 * | 6/2007 | Tanner | 310/339 |

FOREIGN PATENT DOCUMENTS

| | | |
|---|---|---|
| JP | 1186179 A | 7/1989 |
| JP | 4220901 A | 8/1992 |
| JP | 10-056784 A | 2/1998 |
| JP | 10-174462 A | 6/1998 |
| JP | 2008-283157 A | 11/2008 |
| JP | 2008-284532 A | 11/2008 |
| WO | WO-2009-063610 A1 | 11/2008 |

OTHER PUBLICATIONS

PCT/JP2010/060030 Written Opinion dated Aug. 11, 2010.

* cited by examiner

*Primary Examiner* — Derek Rosenau
(74) *Attorney, Agent, or Firm* — Dickstein Shapiro LLP

(57) ABSTRACT

A piezoelectric power generator that includes a piezoelectric laminate in which a plurality of rectangular-shaped piezoelectric elements each having electrodes formed on a substrate are connected at both ends thereof to each other, and in which a portion other than connection portions is capable of vibrating. In the piezoelectric laminate, a portion of the element at the uppermost layer is a fixed portion, and a weight is mounted to the element (free end) at the lowermost layer. Each piezoelectric element is decreased in rigidity from the element at the uppermost layer toward the element at the lowermost layer.

18 Claims, 10 Drawing Sheets

PIEZOELECTRIC POWER GENERATOR

CROSS REFERENCE TO RELATED APPLICATIONS

The present application is a continuation of International application No. PCT/JP2010/060030, filed Jun. 14, 2010, which claims priority to Japanese Patent Application No. 2009-142789, filed Jun. 15, 2009, the entire contents of each of which are incorporated herein by reference.

FIELD OF THE INVENTION

The present invention relates to a piezoelectric power generator, and in particular, to a piezoelectric power generator for extracting electrical power by converting kinetic energy into electrical energy using a piezoelectric element.

BACKGROUND OF THE INVENTION

In the related art, for example, piezoelectric power generators described in Patent Literatures 1, 2, and 3 are known as piezoelectric power generators that extract electrical power by converting kinetic energy inputted from the outside, into electrical energy using a piezoelectric element, and supply the electrical power to an electrical storage device or the like.

In general, a piezoelectric substrate is supported in a cantilevered state such that one end thereof is fixed and another end thereof is a free end to which a weight is provided. In Patent Literature 1, a piezoelectric substrate is thinned toward a free end thereof, and in Patent Literature 2, a piezoelectric substrate is narrowed in width toward a free end thereof. In addition, in Patent Literature 3 describes a piezoelectric device that is composed of a continuous piezoelectric element that includes a plurality of straight portions arranged and stacked parallel to each other and is folded in zigzag.

Meanwhile, in a cantilever type power generator as described in Patent Literatures 1 and 2, in order to increase an amount of power generation, a cantilever has to be long in length and a vibration space also has to be large. Thus, the power generator is inevitably made large in size. In the piezoelectric device described in Patent Literature 3, size reduction is possible. However, stress tends to concentrate on a fixed end of a stacked piezoelectric element, and thus there is a problem that the fixed end is likely to break. In addition, effective measures have not necessarily been taken to improve power generation efficiency.

Patent Literature 1: Japanese Unexamined Patent Application Publication No. 10-56784
Patent Literature 2: Japanese Unexamined Patent Application Publication No. 10-174462
Patent Literature 3: Japanese Patent No. 4220901

SUMMARY OF THE INVENTION

Therefore, it is an object of the present invention to provide a piezoelectric power generator which causes substantially uniform stress to be applied to each of a plurality of piezoelectric elements, thereby eliminating the possibility that a fixed portion will break and providing great power generation efficiency.

In order to achieve the object described above, a piezoelectric power generator according to an aspect of the present invention includes a piezoelectric laminate in which a plurality of rectangular-shaped piezoelectric elements each having electrodes formed on a substrate are connected at both ends thereof to each other, and in which a portion other than connection portions is capable of vibrating. A portion of the piezoelectric laminate is a fixed portion and an end thereof is a free end. Each piezoelectric element is decreased in rigidity from the fixed portion toward the free end.

In the piezoelectric power generator, from the fixed portion toward the free end, each piezoelectric element is decreased in rigidity, in other words, decreased in spring constant. Thus, stress applied to each piezoelectric element is substantially uniformed from the fixed portion toward the free end, and a problem that the fixed portion is easily destroyed is eliminated. At the same time, power generation efficiency improves. The rigidity of each piezoelectric element can be changed by changing the thickness of the substrate, by changing the width of the substrate, by changing the length of the substrate, by changing the material of the substrate, by changing the density of the substrate, or the like.

According to the present invention, stress applied to each piezoelectric element is substantially uniformed from the fixed portion toward the free end. Thus, the problem that the fixed portion is easily destroyed is eliminated, and power generation efficiency improves.

DETAILED DESCRIPTION OF THE INVENTION

Hereinafter, an embodiment of a piezoelectric power generator according to the present invention will be described with reference to the accompanying drawings.

Figure 1:
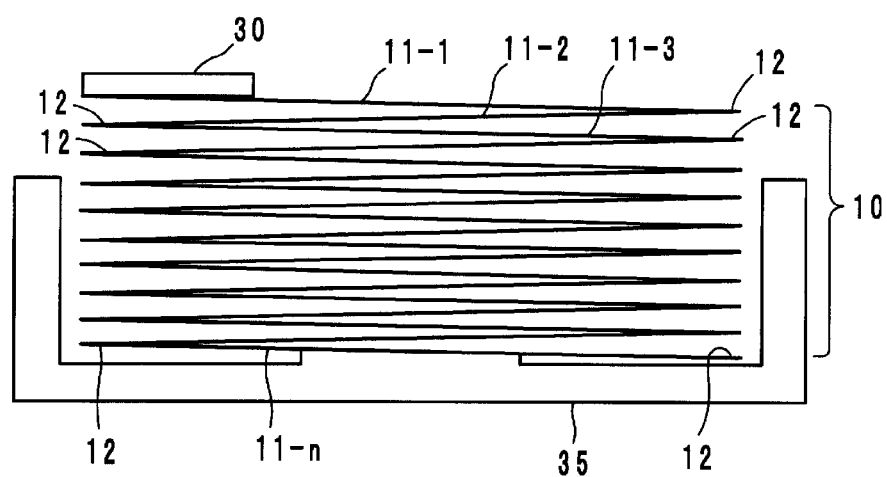
FIG. 1 is a schematic configuration diagram illustrating a basic configuration of a piezoelectric power generator according to the present invention.
Figure 2:
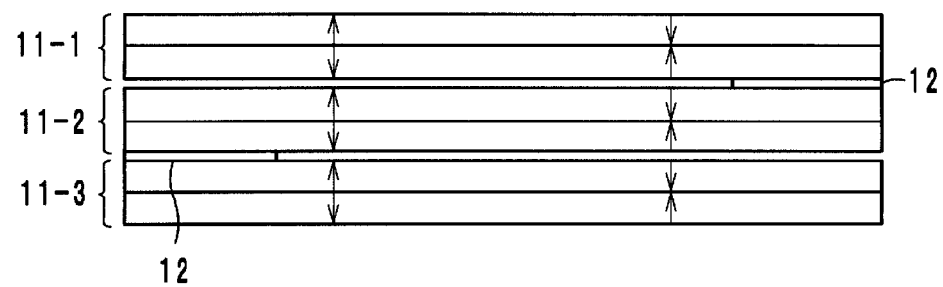
FIG. 2 is a diagram illustrating a relevant portion of the piezoelectric power generator.

(Schematic Configuration of Piezoelectric Power Generator, See FIGS. 1 and 2)

The piezoelectric power generator according to the present invention is composed of a piezoelectric laminate 10 having a lamination structure shown in FIG. 1. In other words, as described in detail below, a plurality of rectangular-shaped piezoelectric elements 11 (11-1, 11-2 . . . 11-$n$) each having electrodes formed on front and back surfaces of a substrate are connected at both ends thereof to each other (connection portions are indicated by reference character 12), and portions other than the connection portions 12 are capable of vibrating. One end of the piezoelectric element 11-1 at the uppermost layer is a fixed portion, and the piezoelectric element 11-$n$ at the lowermost layer is a free end to which a weight 35 is fixed.

As shown in FIG. 2, each piezoelectric element 11 is a bimorph type in which two piezoelectric substrates are joined to each other, and is formed such that polarization directions are opposite to each other on the right and left halves, in a longitudinal direction, of each substrate that is divided at a center thereof (the polarization directions are reversed). In addition, each piezoelectric element 11 is decreased in rigidity from the fixed portion 30 toward the free end (in other words, from the uppermost layer toward the lowermost layer). The rigidity may be rephrased as spring constant.

With regard to a spring constant K, it is set from the piezoelectric element 11-1 at the uppermost layer to the piezoelectric element 11-$n$ at the lowermost layer that $K1 \geq K2 \geq K3 \geq \ldots \geq Kn$ (it should be noted that all Ks are not the same). The spring constant of each piezoelectric element 11 is indicated as $K=12EI/L^3$ (E: Young's modulus, I: cross-sectional secondary moment, L: length of cantilever) and can be changed by the length of cantilever, thickness, width, Young's modulus, and the like.

The weight 35 is preferably has a box shape so as to surround the piezoelectric laminate 10 in order to make efficient use of a space portion as much as possible, and its material is preferably metal or ceramic having a high density.

In the piezoelectric power generator configured schematically above, when the weight 35 is vibrated, the vibrations are transmitted gradually from the piezoelectric element 11-$n$ at the lowermost layer to the piezoelectric element 11-1 at the uppermost layer, the piezoelectric laminate 10 vibrates as a whole, and electrical power is extracted from the electrodes. It should be noted that the electrodes formed in each piezoelectric element 11 and the electrical connection state therebetween will be described below.

Power generation energy of a piezoelectric substance is proportional to the square of a d constant of the piezoelectric substance, the volume of the piezoelectric substance to which stress is applied, the square of the stress, and a wave number, and is inversely proportional to the dielectric constant of the piezoelectric substance. Among them, the wave number is determined by the resonant frequency of the element, but when the resonant frequency of the piezoelectric substance is set within the vibration frequency band, a great amount of power generation can be obtained at low acceleration. However, in general, vibration frequencies in nature are very low, and, for example, the frequency band of vibrations provided in walking is 0 Hz to several tens Hz. In order to obtain a great amount of power generation from vibrations of walking, the resonant frequency of the piezoelectric element is preferably low so as to be less than several tens Hz. In addition, when a method for increasing a volume is used in order to increase power generation energy, for example, when the cross-sectional area of a single cantilever is simply increased, if thickness and width are increased, the cross-sectional secondary moment of the cantilever increases and stress applied to the cantilever decreases. Thus, in order to prevent stress applied to the cantilever from decreasing, it is necessary to take measures such as to increase the weight of the weight 35 connected to the cantilever and to lengthen the cantilever. These measures lead to size increase of the piezoelectric power generator.

For that reason, the piezoelectric power generator has a zigzag folded structure in which a plurality of rectangular-shaped piezoelectric elements are connected at both ends thereof to each other. In this structure, the weights of the weight 35 and the elements at the second and subsequent stages are applied to the fixed portion 30 at the element at the first stage in a concentrating manner, and the weights of the weight 35 and the elements at the third and subsequent stages are applied to the element at the second stage. In other words, the weight of the power generation portion itself can be used, and thus the power generation volume efficiency improves. In addition, the resonant frequency of the power generation portion can be decreased by thinning the piezoelectric element 11 at each stage and increasing the number of lamination stages, without a decrease in volume and making the piezoelectric laminate 10 large in size.

Meanwhile, in the piezoelectric power generator having the zigzag folded structure, to the piezoelectric element 11 at a certain stage, the weights of the elements at stages subsequent to the certain stage are applied. Thus, when the elements 11 of the same thickness (rigidity) are merely laminated, there is a problem that stress concentrates on the fixed portion 30 and the element 11-1 at the uppermost layer. Thus, in the piezoelectric power generator, in order to disperse stress to the element 11 at each stage, the rigidity (spring constant) of the element 11 at each stage is changed, thereby solving the problem. The rigidity of each piezoelectric element can be changed by changing the thickness of the substrate, by changing the width of the substrate, by changing the length of the substrate, by changing the material of the substrate, by changing the density of the substrate, or the like, and their details will be described below.

Further, in the piezoelectric power generator, a plurality of rectangular-shaped piezoelectric elements in which electrodes and the like are previously formed and which are subjected to polarization treatment, are connected at both ends thereof to each other to constitute the piezoelectric laminate 10. Thus, formation of the electrodes and the polarization treatment are not special but are very easy using a normal process for manufacturing a piezoelectric element, and the piezoelectric power generator can be finished with required characteristics. Also for below-described connection between each electrode, it suffices that electrodes formed on the upper surface, the joined surface, and the lower surface of each piezoelectric element 11 are drawn to a side surface of each element 11 and conducted to each other at the side surface by sputtering. Thus, processing is easy, and cost reduction can be achieved.

Figure 3A:
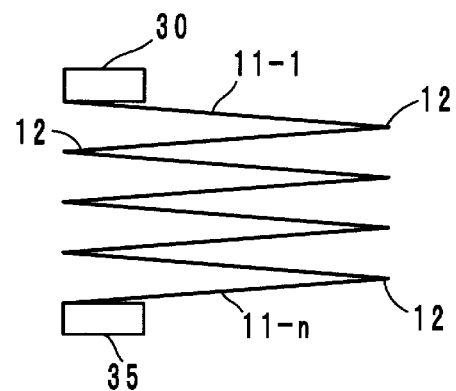
FIGS. 3(A) to 3(C) are diagrams illustrating the positional relation between a fixed portion and a weight in the piezoelectric power generator according to the present invention.
Figure 3B:
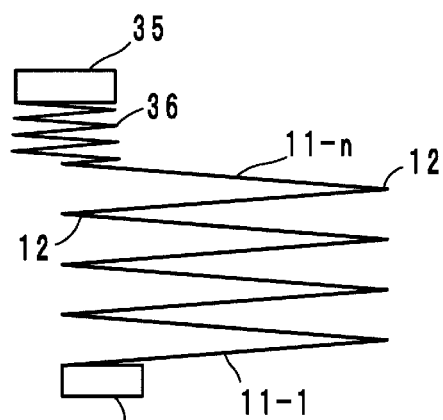
Figure 3C:
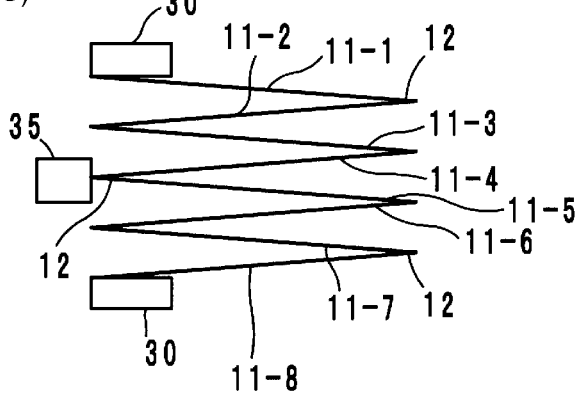

(Positional Relation Between Fixed Portion and Weight, See FIGS. 3(A) to 3(C))

The weight 35 is not necessarily necessary. In general, as shown in FIG. 3(A), the weight 35 is mounted to the free end at the lowermost layer which is most distant from the fixed portion 30 at the piezoelectric element 11-1 at the uppermost layer. It should be noted that the piezoelectric power generator may be disposed in the horizontal direction perpendicular to gravity. FIG. 3(B) illustrates an assumed case where the piezoelectric laminate 10 is disposed in the horizontal direction. The fixed portion 30 may be provided at the piezoelectric element 11-1, and a spring member 36 may be interposed between the other (free end) and the weight 35 mounted thereto. The position to which the weight 35 is mounted is arbitrary. As shown in FIG. 3(C), the weight 35 may be mounted to the connection portion 12 between the piezoelectric elements 11-4 and 11-5 at intermediate layers, and each of ends of the piezoelectric elements 11-1 and 11-8 at both ends may be the fixed portion 30.

Figure 4:
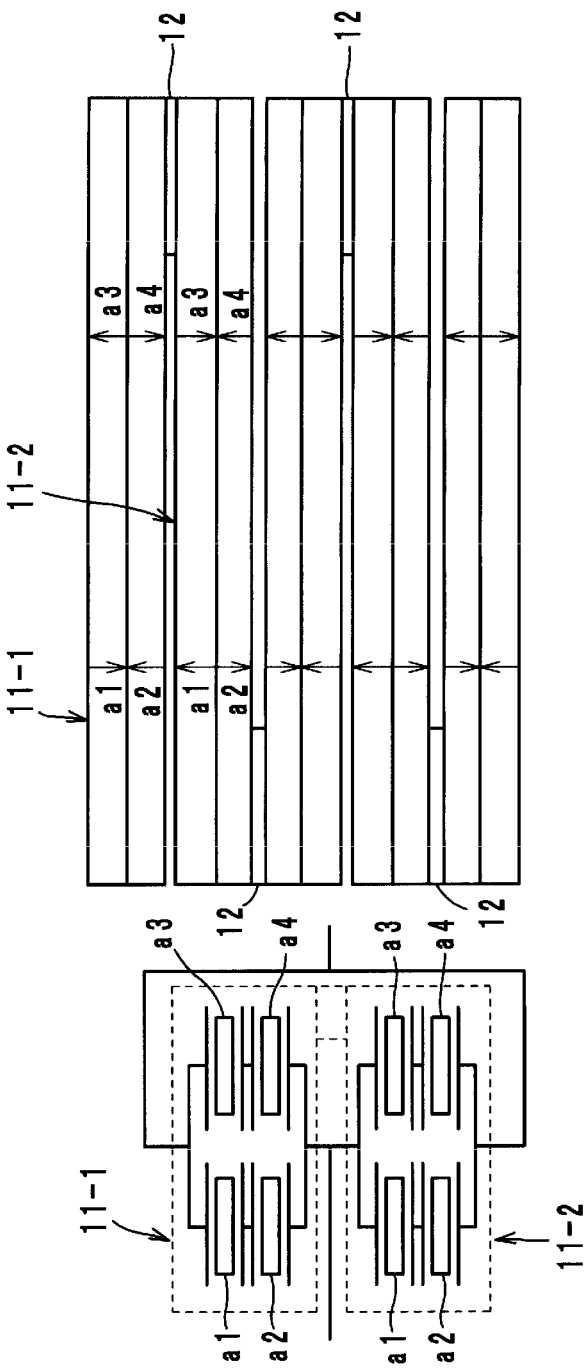
FIG. 4 is a diagram illustrating a first example of the electrical connection relation of each piezoelectric element in the piezoelectric power generator according to the present invention.
Figure 5:
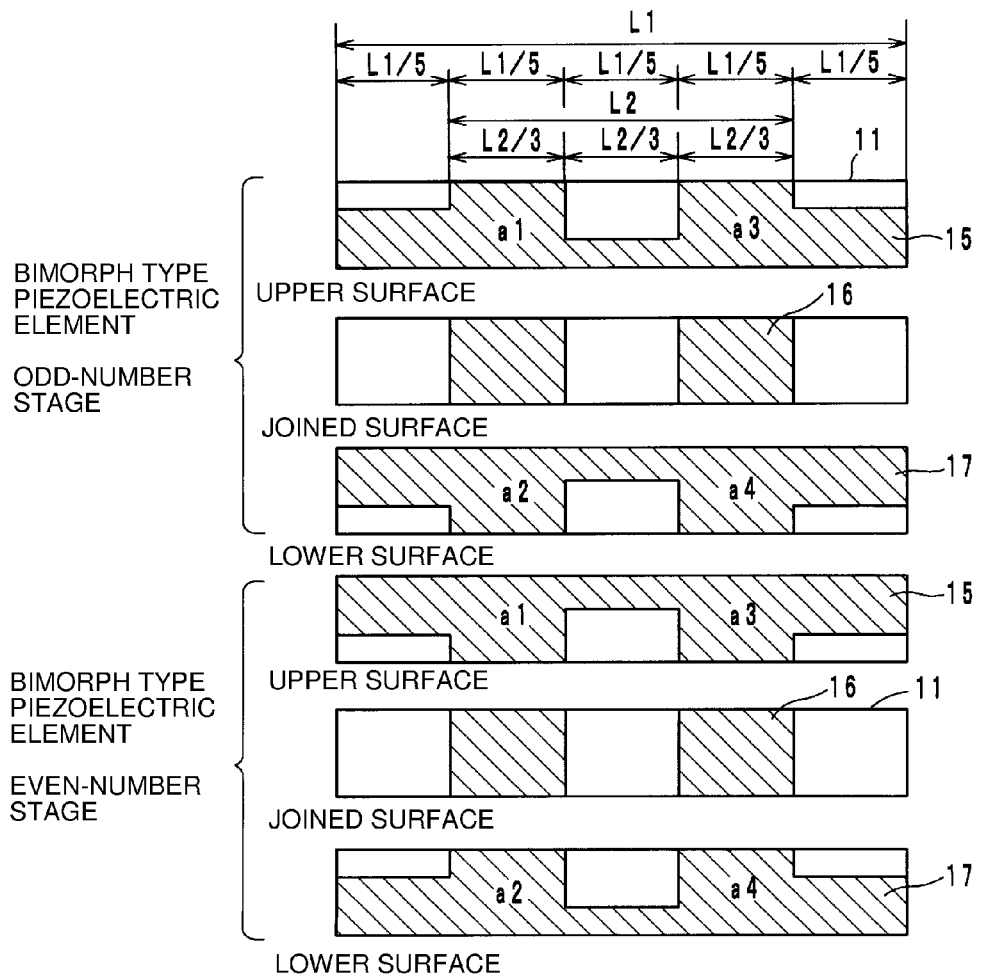
FIG. 5 is a diagram illustrating electrodes of each piezoelectric element in the first example.

(First Example of Electrical Connection of Elements, See FIGS. 4 and 5)

FIG. 4 illustrates a first example of electrical connection of each piezoelectric element. In the first example, as shown in FIG. 4, in each bimorph type piezoelectric element 11, elements a1 and a2 and elements a3 and a4 of which polarization directions indicated by arrows are opposite to each other are connected in series with each other.

In the first example, the shapes of electrodes 15, 16, and 17 formed on the upper surface, the joined surface, and the lower surface of each piezoelectric element 11 are as shown by oblique lines in FIG. 5. In other words, in each bimorph type piezoelectric element 11, the drawn directions of the electrodes 15 and 17 on the upper and lower surfaces are made different between at odd-number stages and at even-number stages, and each of the electrodes 15, 16, and 17 is made to extend to side surfaces of the substrate to form a connection relation shown in FIG. 4.

Figure 6:
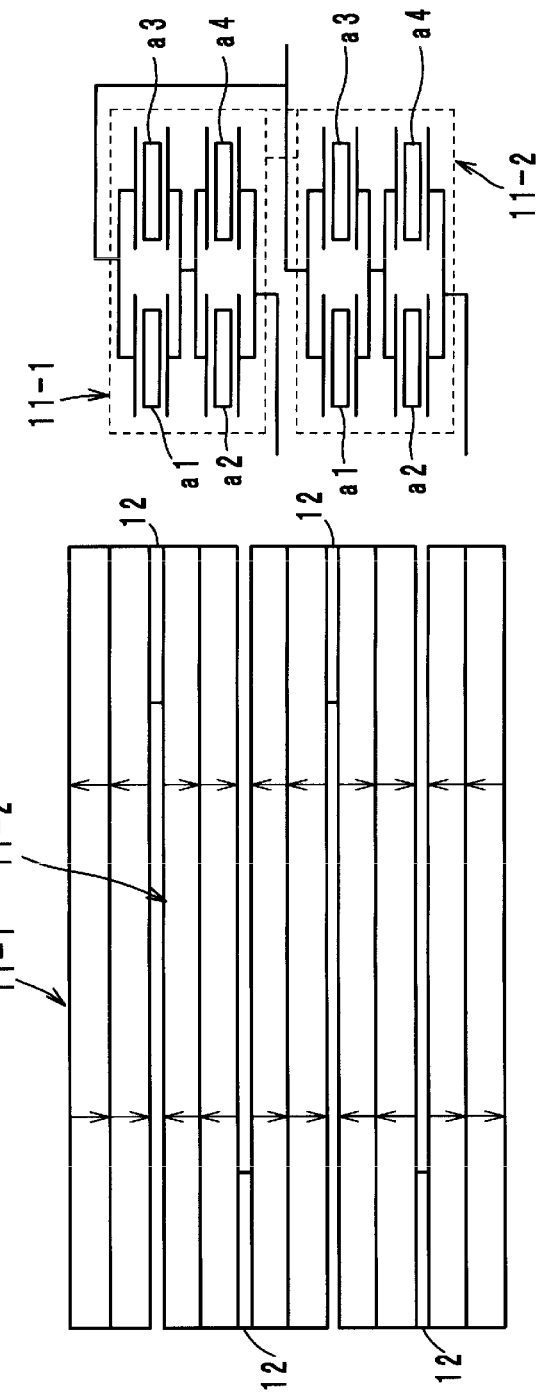
FIG. 6 is a diagram illustrating a second example of the electrical connection relation of each piezoelectric element in the piezoelectric power generator according to the present invention.
Figure 7:
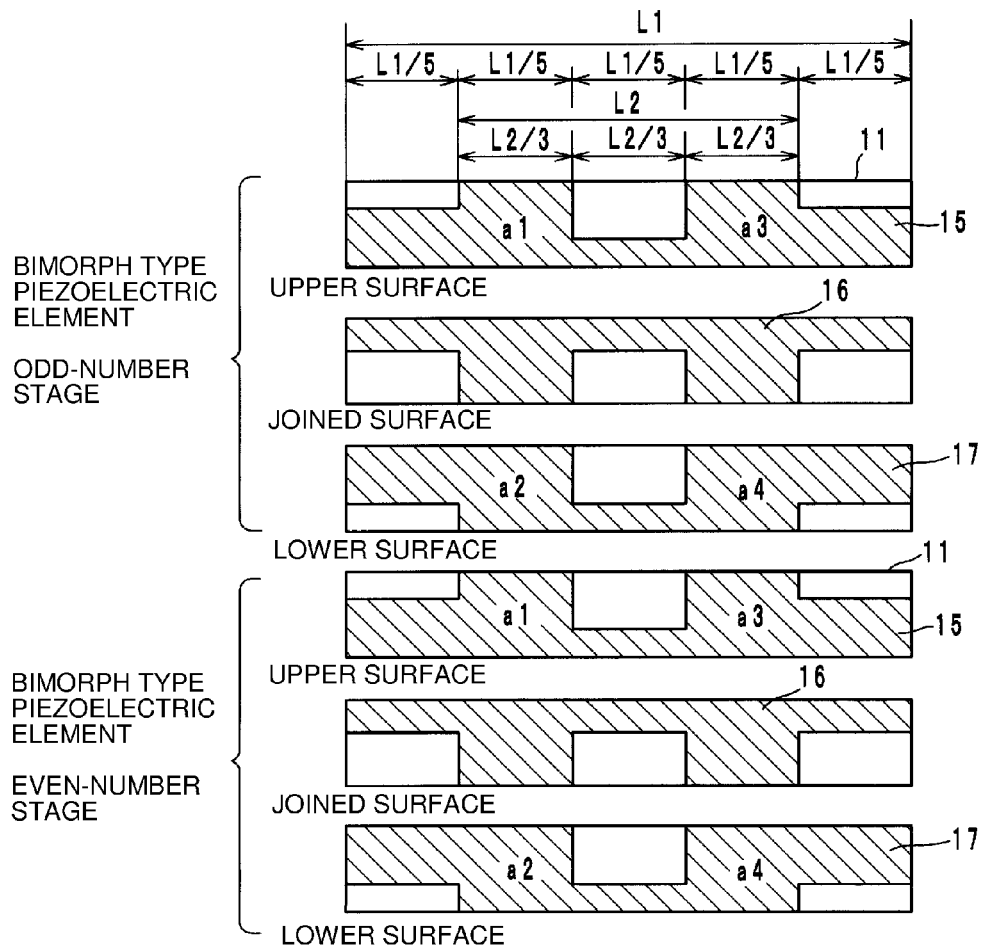
FIG. 7 is a diagram illustrating electrodes of each piezoelectric element in the second example.

(Second Example of Electrical Connection of Elements, See FIGS. 6 and 7)

FIG. 6 illustrates a second example of electrical connection of each piezoelectric element. In the second example, as shown in FIG. 6, in each bimorph type piezoelectric element 11, elements a1 and a3 and elements a2 and a4 of which polarization directions indicated by arrows are opposite to each other are connected in parallel with each other, and the element (a1, a3) and the element (a2, a4) are connected in series with each other.

In the second example, the shapes of electrodes 15, 16, and 17 formed on the upper surface, the joined surface, and the lower surface of each piezoelectric element 11 are as shown by oblique lines in FIG. 7. In other words, in each bimorph type piezoelectric element 11, the drawn directions of the electrodes 15 and 17 on the upper and lower surfaces are made different between at odd-number stages and at even-number stages, and each of the electrodes 15, 16, and 17 is made to extend to side surfaces of the substrate to form a connection relation shown in FIG. 6.

It should be noted that the electrodes 15, 16, and 17 shown in FIG. 7 have partially cut portions in a planar view. However, when cuts are provided in the electrodes 15 and 17 on the upper and lower surfaces, the electrode 16 on the joined surface may be formed on the entirety of the joined surface. On the other hand, when cuts are provided in the electrode 16 on the joined surface, the electrodes 15 and 17 on the upper and lower surfaces may be formed on the entireties of the upper and lower surfaces.

(Locations of Electrodes, See FIGS. 5 and 7 to 9)

Meanwhile, as shown in FIGS. 5 and 7, in each piezoelectric element 11, the electrodes 15, 16, and 17 provided on the upper surface, the joined surface, and the lower surface are cut at side portions between each layer of the piezoelectric element 11 such that the drawn directions of the electrodes 15 and 17 on the upper and lower surfaces of the piezoelectric element 11 are made different from each other, and these electrodes are conducted to each other in a predetermined connection relation. In the central part of the piezoelectric element 11, cuts are formed such that the electrodes facing each other do not overlap each other. The overlap portions and the cut portions are each set in a dimensional relation of L1/5 with respect to the overall length L1 of each piezoelectric element 11. In addition, the lengths of the electrodes other than the drawn electrode portions of the electrodes 15, 16, and 17 which are located at both ends in the L1 direction of the piezoelectric element 11 and have a length of L1/5, namely, the overlap portions and the cut portions, are each set in a dimensional relation of L2/3 with respect to the length L2 of the substantial electrode. In other words, the overlap portions of the electrodes 15, 16, and 17 are formed in regions having about ⅓ of the length L2 of the substantial electrode and extending from both ends, respectively.

Figure 8:
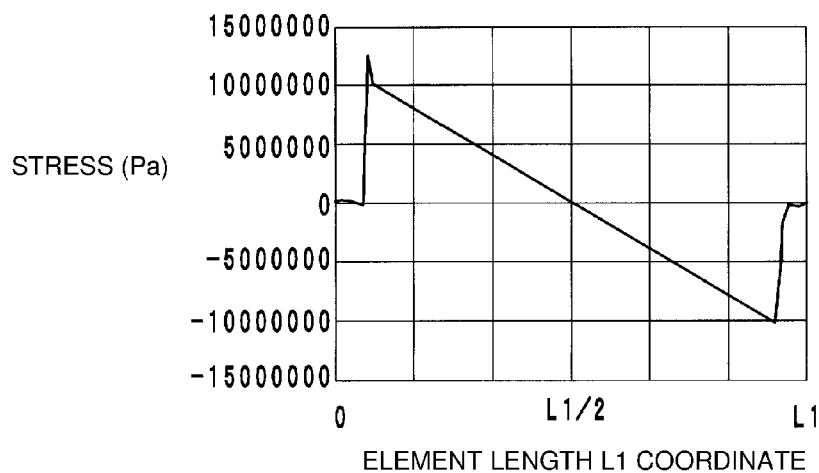
FIG. 8 is a graph showing a surface stress distribution in each piezoelectric element.

When the cross-sectional secondary moment of the piezoelectric element 11 is uniform in the longitudinal direction, signs of stresses at both ends of each element 11 in the lamination structure of the embodiment are different from each other (in the case of compressive stress at one end, tensile stress is at the other end) and stress at the center is 0 as shown in FIG. 8. In FIG. 8, the unit of the vertical axis is Pa. With regard to power generation energy generated at each piezoelectric element 11, where the length of the substantial electrode of the electrode is L2, when the overlap portions extend from both ends, respectively, of the substantial electrode by the equal length, maximum power generation energy can be obtained if the overlap portions of the electrode satisfy a specific condition, as shown in FIG. 9.

Figure 9:
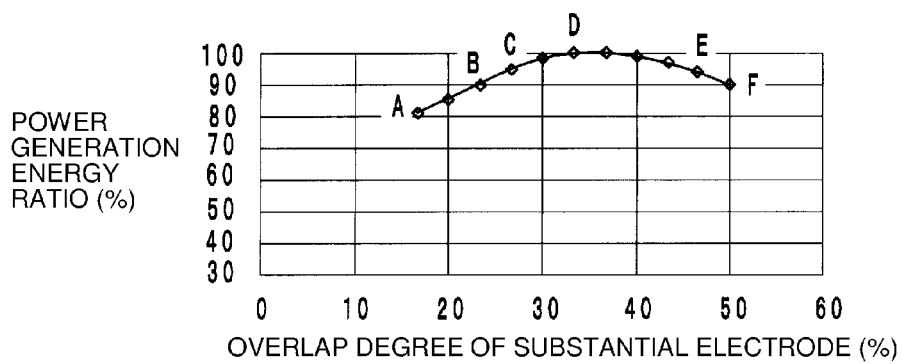
FIG. 9 is a graph showing the relation between an electrode length and power generation energy.

Here, a value obtained by dividing the length of one of the overlap portions of the electrode having the same lengths by the length of the substantial electrode is indicated as an overlap degree (%) of the substantial electrode in the horizontal axis in FIG. 9. The value of the overlap degree of the substantial electrode is 0 to 50%. In FIG. 9, the vertical axis indicates a power generation energy ratio (%) at a scale of 10%, and the power generation energy ratio (%) is a ratio (%) obtained by dividing power generation energy (J) obtained when the overlap degree (%) of the substantial electrode is changed, by the value of power generation energy that is maximum power generation energy (J) obtained when the overlap degree of the substantial electrode is 33%. In other words, according to the experimental result shown in FIG. 9, the power generation energy ratio is 82% at A point at which the overlap degree of the substantial electrode is 17%, is 90% at B point at which the overlap degree of the substantial electrode is 23%, is 95% at C point at which the overlap degree of the substantial electrode is 27%, is 100% at D point at which the overlap degree of the substantial electrode is 33%, is 95% at E point at which the overlap degree of the substantial electrode is 47%, and is 90% at F point at which the overlap degree of the substantial electrode is 50%. In this case, when the range of the overlap degree of the substantial electrode is set so as to be 23% to 50%, the power generation energy can be equal to or higher than 90% of the maximum value at which the overlap degree of the substantial electrode is 33%, and thus this is preferable. In addition, since no electrode overlap portion is provided at the center of the piezoelectric element, an amount of extracted electrical power is suppressed in a region where stress and polarization directions of the piezoelectric substance are inverted and an electric charge distribution is unstable, and hence stable power generation energy is obtained, which is thus preferable. Further, when the range of the overlap degree of the substantial electrode is set so as to be 27% to 47%, the power generation energy can be equal to or higher than 95% of the maximum value, and thus this is preferable. It should be noted that in the embodiments shown in FIGS. 4 and 7, the overlap degree of the substantial electrode is 33%.

(Change in Rigidity of Elements, See FIGS. 10 to 16)

Figure 10:
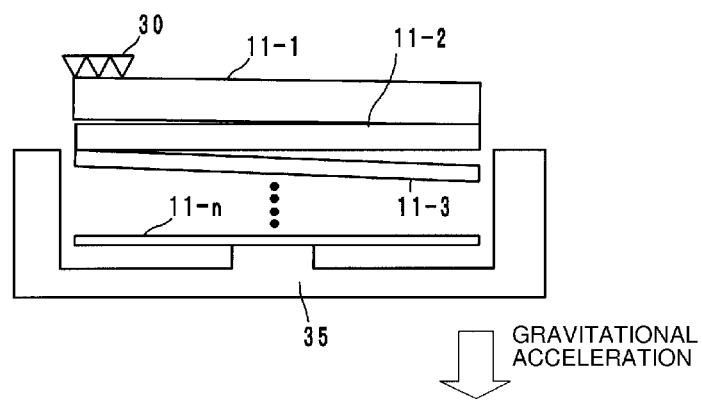
FIG. 10 is a schematic configuration diagram illustrating a piezoelectric power generator in which each piezoelectric element is changed in thickness.

An example where the thickness of the substrate is changed in order to change the rigidity of each piezoelectric element 11 is illustrated in FIG. 10. In other words, the thickness of the element substrate is decreased gradually from the piezoelectric element 11-1 at the uppermost layer toward the piezoelectric element 11-$n$ at the lowermost layer. By so doing, the spring constant of the piezoelectric element 11-1 at the uppermost layer is made highest, and the spring constant is decreased toward the lower layers.

Figure 11:
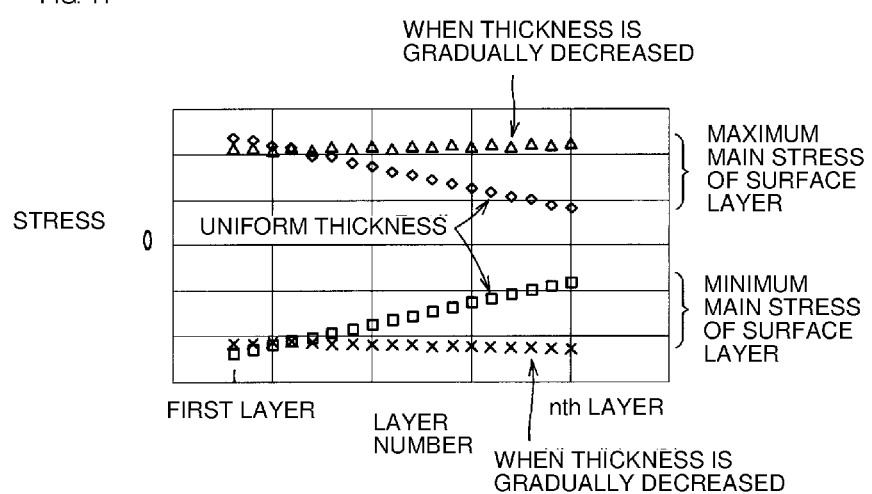
FIG. 11 is a graph showing stress in each layer of a piezoelectric element when the thickness is changed.

Due to this, as shown in FIG. 11, it is possible to substantially uniformly disperse stress on the surface of the piezoelectric element 11 at each layer which surface is at the boundary with the connection portion 12. For example, since concentration of stress on the fixed portion is alleviated, reliability can be improved, and since the sum of maximum main stress applied to the piezoelectric substance at each layer is increased, an amount of power generation can be increased. Incidentally, in FIG. 11, the horizontal axis indicates the layer number of the piezoelectric substance at each layer from the first layer to the nth layer, the vertical axis indicates stress applied to the joined surface of the piezoelectric element 11 at each layer, and outline triangle marks and X marks indicate characteristics (a stress value corresponding to each layer number) when the thickness of the piezoelectric element 11 is gradually decreased. In FIG. 11, for comparison, characteristics (a stress value corresponding to each layer number) when the thickness is uniform at each layer are also indicated by outline rhombus marks and outline square marks. It should be noted that changing the thickness for all the layers is troublesome in terms of processing, and thus the thickness may be changed in a stepwise manner (e.g., per 2 stages) taking the balance between processability and stress into account.

Figure 12:
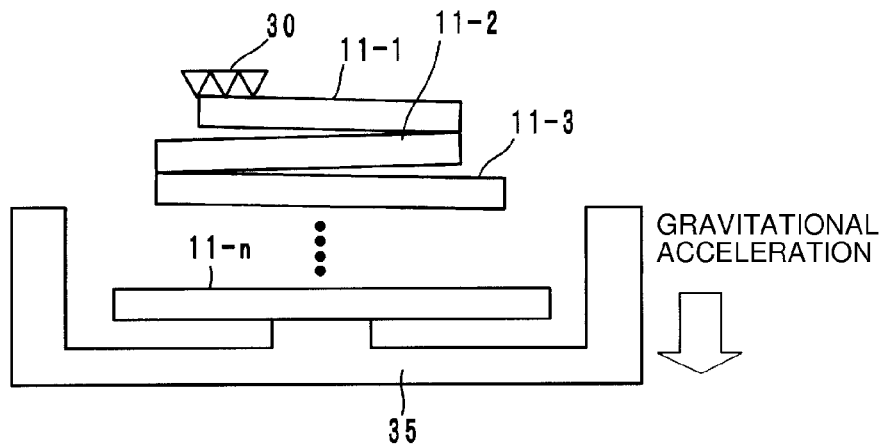
FIG. 12 is a schematic configuration diagram illustrating a piezoelectric power generator in which each piezoelectric element is changed in length.

An example where the length of the substrate is changed in order to change the rigidity of each piezoelectric element 11 is illustrated in FIG. 12. In other words, the length of the element substrate is gradually increased from the piezoelectric element 11-1 at the uppermost layer to the piezoelectric element 11-$n$ at the lowermost layer. By so doing, the spring constant of the piezoelectric element 11-1 of the uppermost layer is made highest, and the spring constant is decreased toward the lower layers. It should be noted that the length may be changed in a stepwise manner (e.g., per 2 stages) taking the balance between processability and stress into account.

Figure 13:
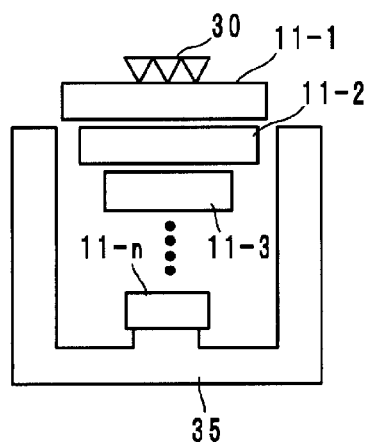
FIG. 13 is a schematic configuration diagram illustrating a piezoelectric power generator in which each piezoelectric element is changed in width.

An example where the width of the substrate is changed in order to change the rigidity of each piezoelectric element 11 is illustrated in FIG. 13. In other words, the width of the element substrate is gradually decreased from the piezoelectric element 11-1 at the uppermost layer to the piezoelectric element 11-$n$ at the lowermost layer. By so doing, the spring constant of the piezoelectric element 11-1 at the uppermost layer is made highest, and the spring constant is decreased toward the lower layers. It should be noted that the width may be changed in a stepwise manner (e.g., per 2 stages) taking the balance between processability and stress into account.

Figure 14:
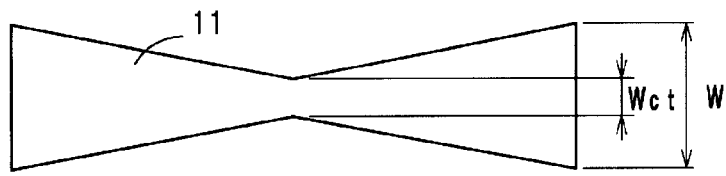
FIG. 14 is a plan view illustrating a piezoelectric element that is changed in width.
Figure 15:
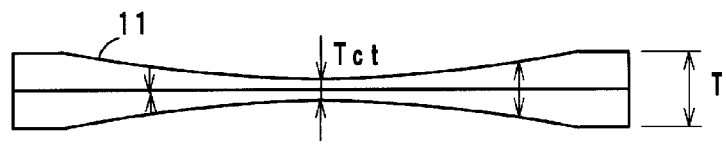
FIG. 15 is a side view illustrating a piezoelectric element that is changed in thickness.
Figure 16:
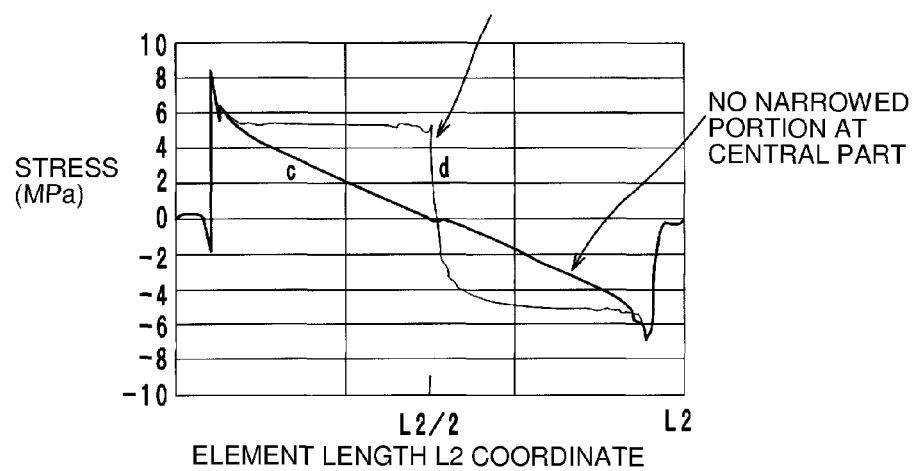
FIG. 16 is a graph showing a surface stress distribution of a piezoelectric element in shape change in FIG. 14.

In addition to changing the thickness, the length, and the width of the element substrate as described above, the cross-sectional secondary moment may be gradually decreased from both ends of the element substrate to the central part thereof. FIG. 14 shows a shape in which the width dimension of the element 11 is gradually decreased from W to Wct toward the central part. In addition, FIG. 15 shows a shape in which the thickness dimension of the element 11 is gradually decreased from T to Tct toward the central part.

When the rigidity of each piezoelectric element is changed as described above, stress in each layer can be uniformed. It should be noted that when the shape in each layer (each piezoelectric element 11) is a simple rectangle (there is no narrowed portion at the central part), a stress distribution in which signs of stresses are different from each other (in the case of compressive stress at one end, tensile stress is at the other end) and stress at the center is 0 is indicated as shown by a curved line c in FIG. 16 (the same as in the graph of FIG. 8), and the stress tends to concentrate on both ends. Thus, when stress at each point in the longitudinal direction of the element substrate is made proportional to the cross-sectional secondary moment at the point, stress can be substantially uniformed in the longitudinal direction in each piezoelectric element 11. A curved line d in FIG. 16 indicates a stress distribution when a narrowed portion is provided in the central part as shown in FIG. 14. Therefore, stress is substantially uniformed in the power generation activated region of the piezoelectric element 11, average stress applied to the piezoelectric substance improves, and the power generation efficiency improves.

Other Embodiments

It should be noted that the piezoelectric power generator according to the present invention is not limited to the embodiment described above, and can be modified in a variety of ways within the scope of the present invention.

For example, in the embodiment described above, each piezoelectric element is illustrated as a bimorph type in which two piezoelectric substrates are joined to each other. However, a reinforcing plate may be disposed on the joined surface of the two piezoelectric substrates, or each piezoelectric element may be a unimorph type in which electrodes are formed on upper and lower surfaces of a single piezoelectric substrate and a reinforcing plate is preferably joined to at least one principal surface of the single piezoelectric substrate.

As described above, the present invention is useful for a piezoelectric power generator. In particular, since substantially uniform stress is applied to each of a plurality of piezoelectric elements, the present invention is excellent in that the fixed portion is unlikely to be broken and the power generation efficiency is great.

REFERENCE NUMBER LIST

10: piezoelectric laminate
11 (11-1, 11-2 . . . 11-$n$): piezoelectric element
12: connection portion
15, 16, 17: electrode
30: fixed portion
35: weight

The invention claimed is:
1. A piezoelectric power generator comprising:
a piezoelectric laminate having a plurality of piezoelectric elements each having electrodes on opposed surfaces of a substrate, the piezoelectric elements being connected together in a zigzag structure, wherein
the piezoelectric laminate includes a vibrating portion, a fixed portion and a free end, and
a rigidity of each piezoelectric element decreases from the fixed portion toward the free end.
2. The piezoelectric power generator according to claim 1, wherein the plurality of piezoelectric elements are rectangular-shaped.

3. The piezoelectric power generator according to claim 1, wherein the plurality of piezoelectric elements are bimorph piezoelectric elements.

4. The piezoelectric power generator according to claim 1, wherein the rigidity of each piezoelectric element is based on a thickness of the substrate.

5. The piezoelectric power generator according to claim 4, wherein the thickness of the substrate decreases from the fixed portion to the free end.

6. The piezoelectric power generator according to claim 1, wherein the rigidity of the piezoelectric element is based on a width of the substrate.

7. The piezoelectric power generator according to claim 6, wherein the width of the substrate decreases from the fixed portion to the free end.

8. The piezoelectric power generator according to claim 1, wherein the rigidity of the piezoelectric element is based on a length of the substrate.

9. The piezoelectric power generator according to claim 8, wherein the length of the substrate increases from the fixed portion to the free end.

10. The piezoelectric power generator according to claim 1, wherein the rigidity of the piezoelectric element is based on a material of the substrate.

11. The piezoelectric power generator according to claim 1, wherein the rigidity of the piezoelectric element is based on a density of the substrate.

12. The piezoelectric power generator according to claim 1, wherein the rigidity of the piezoelectric element is based on a central, cross-sectional secondary moment of the substrate.

13. The piezoelectric power generator according to claim 1, wherein opposite sides of each piezoelectric element have opposite polarization directions.

14. The piezoelectric power generator according to claim 13, wherein the electrodes on the opposed surfaces of the substrate overlap each other in portions thereof extending from opposite ends of the electrode and are ⅓ of a longitudinal length of the electrode.

15. The piezoelectric power generator according to claim 1, wherein a piezoelectric element having a highest rigidity among each piezoelectric element is the fixed portion.

16. The piezoelectric power generator according to claim 15, further comprising a weight mounted to a piezoelectric element having a lowest rigidity among each piezoelectric element.

17. The piezoelectric power generator according to claim 1, further comprising a weight attached to the free end of the piezoelectric laminate.

18. The piezoelectric power generator according to claim 1, wherein the plurality of piezoelectric elements in the piezoelectric laminate are arranged in odd-number stages and even-number stages, and, for each of the plurality of piezoelectric elements, the electrodes on the opposed surfaces of the substrate differ from each other between the odd-number stages and the even-number stages.

* * * * *